US011515416B2

(12) United States Patent
Mehrotra (10) Patent No.: US 11,515,416 B2
(45) Date of Patent: Nov. 29, 2022

(54) LATERALLY-DIFFUSED METAL-OXIDE SEMICONDUCTOR TRANSISTOR AND METHOD THEREFOR

(71) Applicant: NXP USA, INC., Austin, TX (US)

(72) Inventor: Saumitra Raj Mehrotra, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/029,586

(22) Filed: Sep. 23, 2020

(65) Prior Publication Data

US 2022/0093793 A1   Mar. 24, 2022

(51) Int. Cl.
*H01L 21/336* (2006.01)
*H01L 29/78* (2006.01)
(Continued)

(52) U.S. Cl.
CPC .. *H01L 29/7825* (2013.01); *H01L 21/823468* (2013.01); *H01L 29/4236* (2013.01); *H01L 29/66553* (2013.01)

(58) Field of Classification Search
CPC ..... H01L 29/66; H01L 29/78; H01L 29/7813; H01L 29/7825; H01L 29/6653; H01L 29/6656; H01L 29/51; H01L 29/518; H01L 29/66719; H01L 29/66689; H01L 29/423; H01L 29/4983; H01L 29/66613; H01L 29/66628; H01L 29/66553; H01L 29/4236; H01L 29/42336; H01L 29/42352; H01L 21/768; H01L 21/2815; H01L 21/7685; H01L 21/28132; H01L 21/76852; H01L 21/8234; H01L 21/8238; H01L 21/823468; H01L 21/823864; H01L 21/76805; H01L 21/76895; H01L 21/40; H01L 21/06; H01L 21/407; H01L 21/404; H01L 21/0653; H01L 21/0692; H01L 21/7835; H01L 21/66659; H01L 23/48; H01L 23/481; H01L 29/7816; H01L 29/66681; H01L 29/7824; H01L 29/0873; H01L 29/0886; H01L 29/7836; H01L 29/7833;
(Continued)

(56) References Cited

U.S. PATENT DOCUMENTS 9,842,903 B2   12/2017 Lu et al.
9,859,416 B2   1/2018 Mori et al.
(Continued)

OTHER PUBLICATIONS

Fujii, H., "A Recessed Gate LDMOSFET for Alleviating HCI Effects", 2016 28th International Symposium on Power Semiconductor Devices and ICs (ISPSD). IEEE, Jun. 2016.
(Continued)

*Primary Examiner* — Chuong A Luu (57) ABSTRACT

A transistor includes a trench formed in a semiconductor substrate. A conductive spacer is formed in the trench and offset from a first sidewall of the trench. A dielectric material is formed in the trench and surrounds the conductive spacer. A drift region is formed in the semiconductor substrate adjacent to the first sidewall and a first portion of a second sidewall of the trench. A drain region is formed in the drift region adjacent to a second portion of the second sidewall. A first gate region overlaps a portion of the drift region and is formed separate from the conductive spacer.

11 Claims, 13 Drawing Sheets

(51) Int. Cl.
*H01L 21/8234* (2006.01)
*H01L 29/423* (2006.01)
*H01L 29/66* (2006.01)

(58) Field of Classification Search
CPC ......... H01L 29/66704; H01L 29/66734; H01L 29/7826; H01L 29/7802; H01L 29/7815; H01L 29/66712
USPC .................................. 257/330; 438/212, 268
See application file for complete search history.

(56) References Cited

U.S. PATENT DOCUMENTS

| | | | |
|---|---|---|---|
| 2006/0038224 A1 | 2/2006 | Shibib et al. | |
| 2009/0166736 A1 | 7/2009 | Park | |
| 2012/0094457 A1* | 4/2012 | Gabrys | H01L 29/66689 |
| | | | 438/286 |
| 2014/0042527 A1 | 2/2014 | Lee et al. | |
| 2014/0374824 A1* | 12/2014 | Calafut | H01L 29/66712 |
| | | | 257/334 |
| 2015/0200250 A1* | 7/2015 | Lin, I | H01L 29/66734 |
| | | | 257/481 |
| 2017/0104097 A1* | 4/2017 | Park | H01L 29/404 |
| 2021/0184034 A1* | 6/2021 | Mehrotra | H01L 29/0653 |

OTHER PUBLICATIONS

Liu, H., "A novel high-voltage LDMOS with shielding-contact structure for HCI SOA enhancement", 2017 29th International Symposium on Power Semiconductor Devices and IC's (ISPSD). IEEE, May-Jun. 2017.

U.S. Appl. No. 16/692,126, filed Nov. 22, 2019, entitled "Laterally-Diffused Metal-Oxide Semiconductor Transistor and Method Therefor".

Mehrotra, S., "Towards Ultimate Scaling of LDMOS with Ultralow Specific On-Resistance", 2020 32nd International Symposium on Power Semiconductor Devices and ICS (ISPSD), Sep. 13-18, 2020.

* cited by examiner

LATERALLY-DIFFUSED METAL-OXIDE SEMICONDUCTOR TRANSISTOR AND METHOD THEREFOR

BACKGROUND

Field

This disclosure relates generally to semiconductor devices, and more specifically, to laterally-diffused metal-oxide semiconductor (LDMOS) transistors and method of forming the same.

Related Art

Traditional semiconductor devices and semiconductor device fabrication processes are well known. For example, metal oxide semiconductor field-effect transistors (MOSFETs) are commonly used in a variety of different applications and electronic products—from sewing machines to washing machines, from automobiles to cellular telephones, and so on. As process technology progresses, these semiconductor devices are expected to reduce in size and cost while increasing performance. However, challenges exist in balancing size, cost, performance, and long-term reliability.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a shallow trench isolation (STI) laterally-diffused metal-oxide semiconductor (LDMOS) transistor. A trench is formed in a drift region of a substrate of the LDMOS transistor. A drain region is formed at the surface of the semiconductor substrate adjacent to a first sidewall the trench. A source region is formed at the surface of the semiconductor substrate separated from a second sidewall of the trench by a predetermined distance. A conductive spacer is formed in the trench proximate to the second sidewall of the trench. After the conductive spacer is formed, the trench is filled with a dielectric material. The conductive spacer is configured to lower impact ionization at the first sidewall of the trench improving overall reliability of the LDMOS transistor.

FIG. 1 through FIG. 9 illustrate, in simplified cross-sectional views, various stages of manufacture of an example laterally-diffused metal-oxide semiconductor (LDMOS) transistor 100 in accordance with an embodiment.

Figure 1:
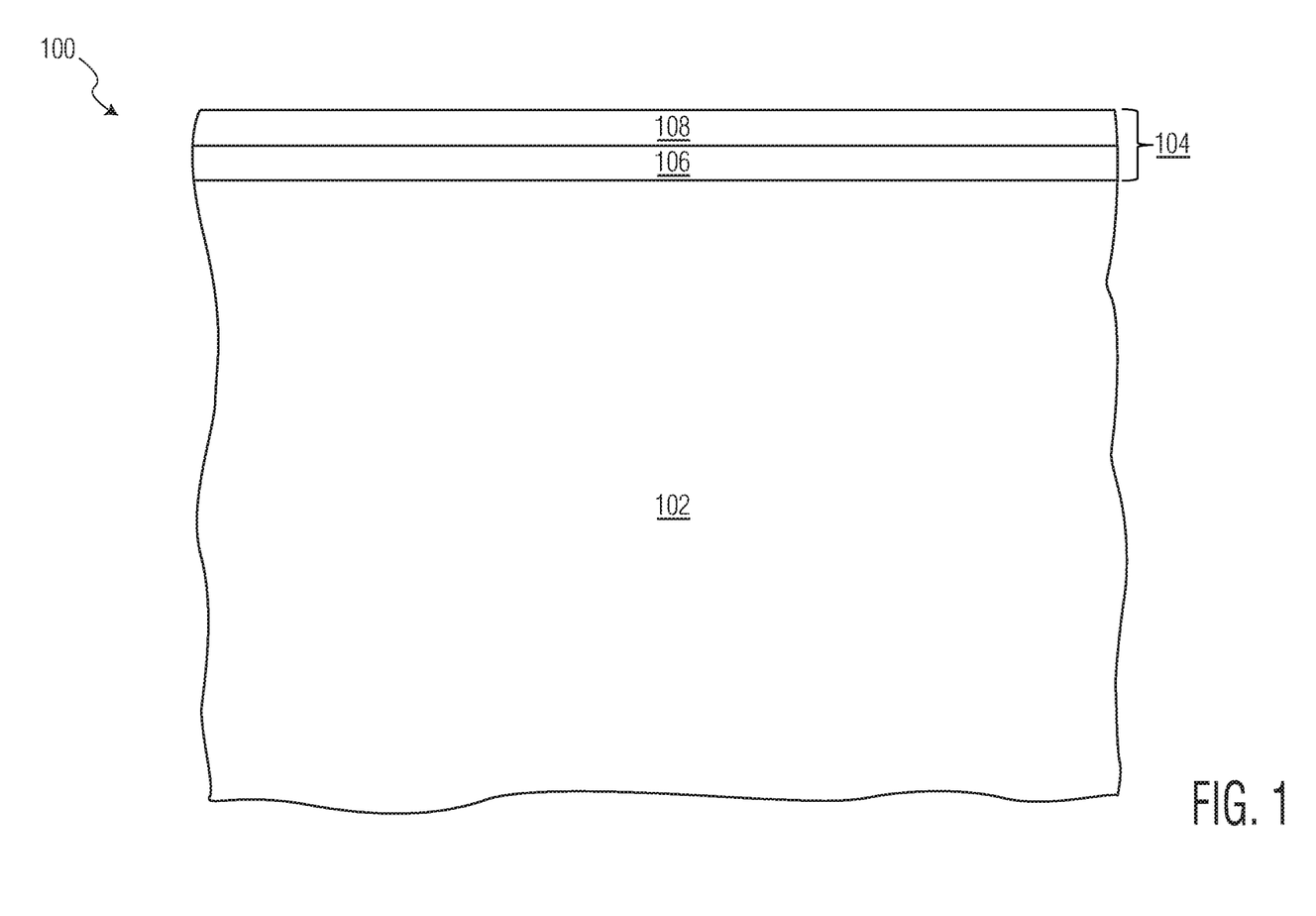
FIG. 1 through FIG. 9 illustrate, in simplified cross-sectional views, various stages of manufacture of an example laterally-diffused metal-oxide semiconductor (LDMOS) transistor in accordance with an embodiment.

FIG. 1 illustrates in a simplified cross-sectional view, the example LDMOS transistor 100 at a stage of manufacture in accordance with an embodiment. At this stage, transistor 100 includes a silicon-based substrate 102 and a hard mask 104 formed over the substrate 102. In this embodiment, the substrate 102 is formed as a P-type doped silicon substrate having a P-type conductivity type. Substrate 102 may be formed as a P-type doped silicon substrate having an N-type epitaxial layer. Substrate 102 may alternatively be formed from other suitable silicon-based substrates such as gallium arsenide, silicon germanium, silicon-on-insulator (SOI), silicon, monocrystalline silicon, the like, and combinations thereof, for example.

In this embodiment, a nitride layer 106 is formed on the on substrate 102, and an oxide layer 108 is formed on the nitride layer 106. The nitride/oxide layers together are patterned to form the hard mask 104. In other embodiments, other suitable materials and combinations thereof may be used to form hard mask 104.

Figure 2:
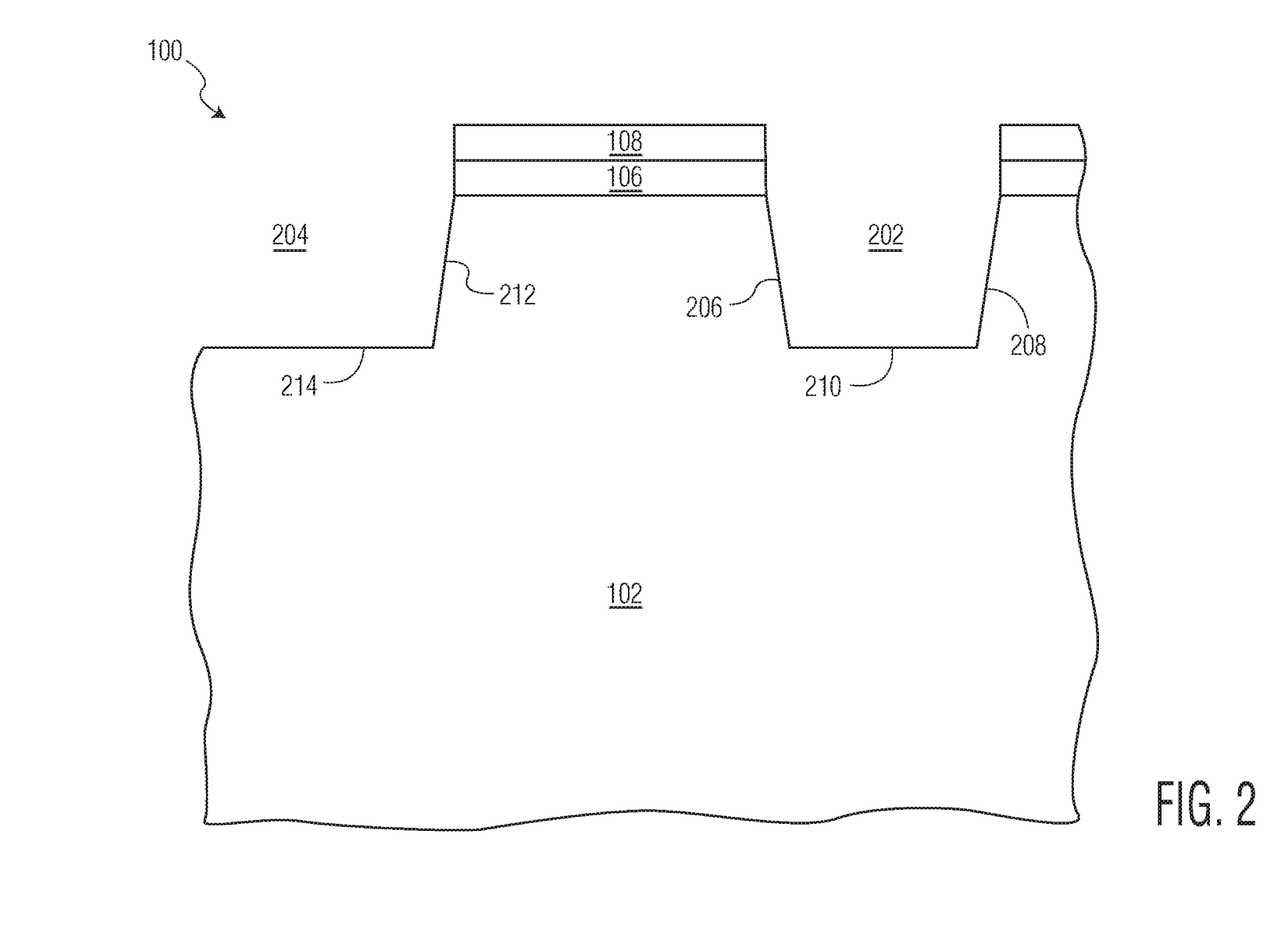

FIG. 2 illustrates in a simplified cross-sectional view, the example LDMOS transistor 100 at a subsequent stage of manufacture in accordance with an embodiment. At this stage, transistor 100 includes shallow trenches 202 and 204 formed in the substrate 102. In this embodiment, the trench 202 includes a first sidewall 206, a second sidewall 208, and a bottom surface 210. The trench 204 includes a first sidewall 212 and a bottom surface 214. In this embodiment, the trenches 202 and 204 are etched to a predetermined depth of approximately 0.3 microns. In other embodiments, the trenches 202 and 204 may be etched to depths other than approximately 0.3 microns. Etch techniques such as reactive ion etching (RIE) may be employed to form trenches 202 and 204, for example.

Figure 3:
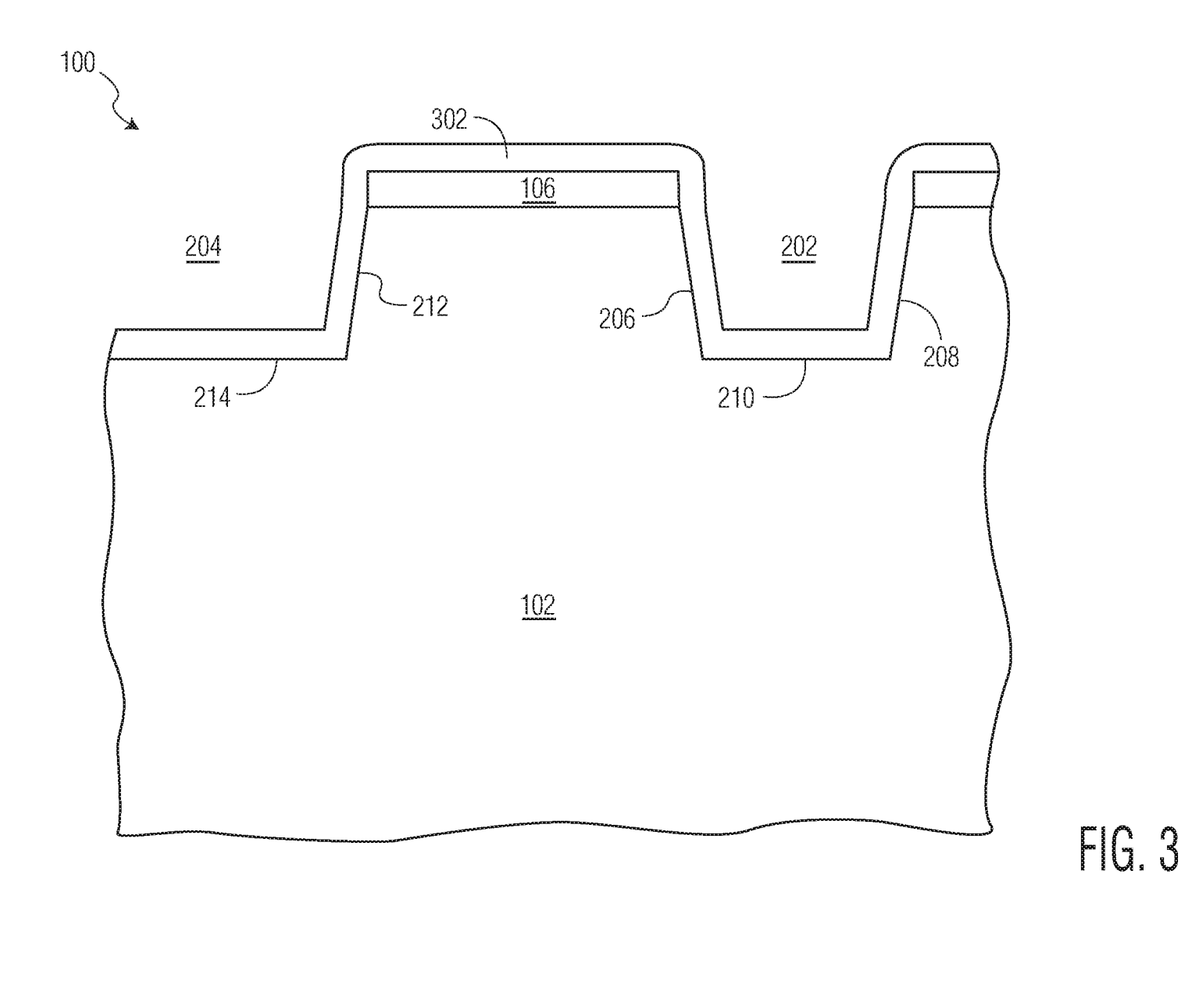

FIG. 3 illustrates in a simplified cross-sectional view, the example LDMOS transistor 100 at a subsequent stage of manufacture in accordance with an embodiment. At this stage, transistor 100 includes a non-conductive layer 302 formed over the substrate 102. The non-conductive layer 302 may be formed from a deposited oxide layer such as tetraethyl orthosilicate (TEOS), for example. In this embodiment, the non-conductive layer 302 is formed to have a predetermined thickness of approximately 0.1 microns at the sidewalls of the trenches 202 and 204. In other embodiments, non-conductive layer 302 may be formed to desired thicknesses other than approximately 0.1 microns.

Figure 4:
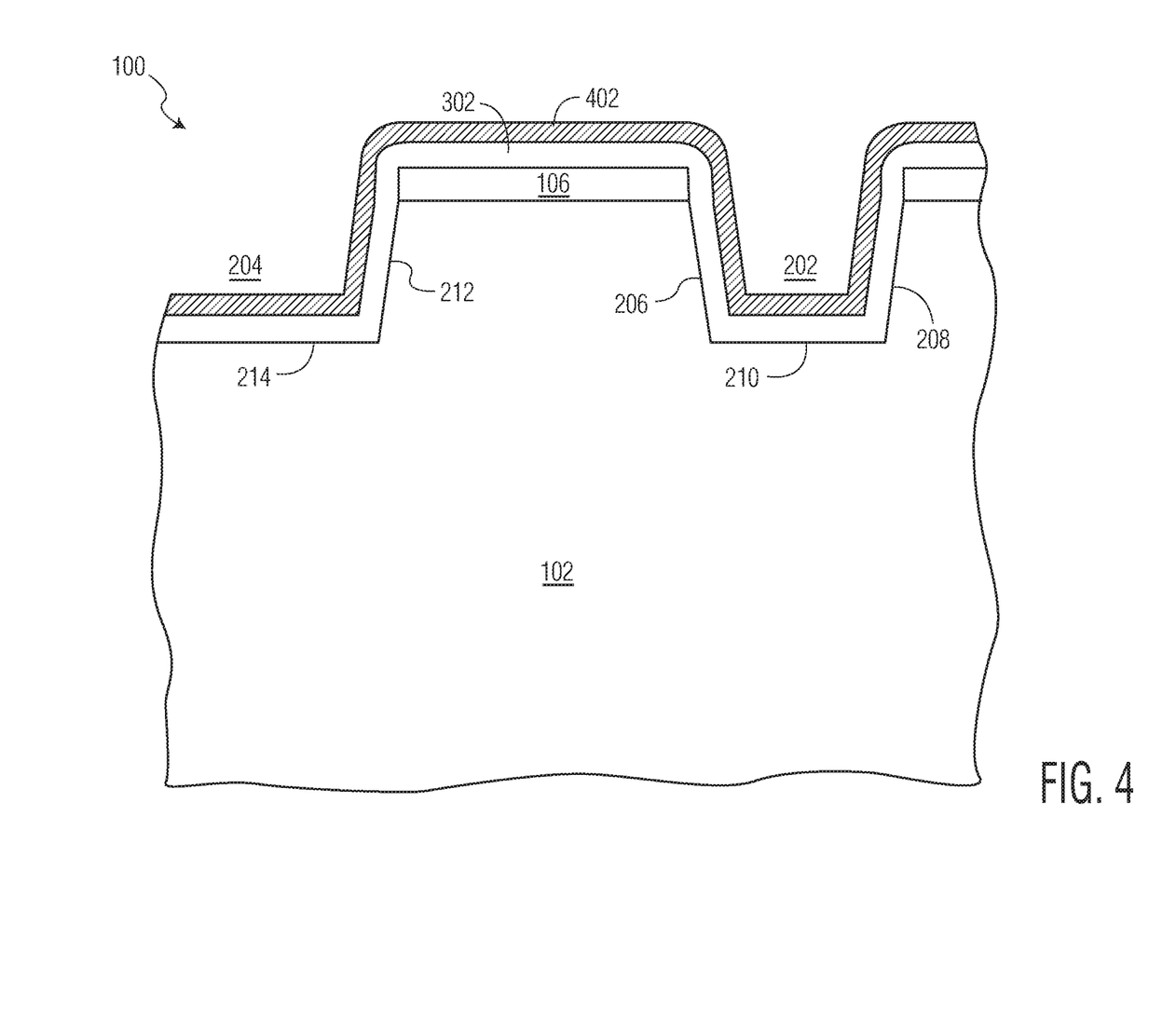

FIG. 4 illustrates in a simplified cross-sectional view, the example LDMOS transistor 100 at a subsequent stage of manufacture in accordance with an embodiment. At this stage, transistor 100 includes a conductive layer 402 formed on the non-conductive layer 302. The conductive layer 402 may be formed from a deposited polysilicon material, for example. In this embodiment, the conductive layer 402 is formed to have a predetermined thickness of approximately 0.1 microns at the sidewalls of the trenches 202 and 204. In other embodiments, conductive layer 402 may be formed to desired thicknesses other than approximately 0.1 microns.

Figure 5:
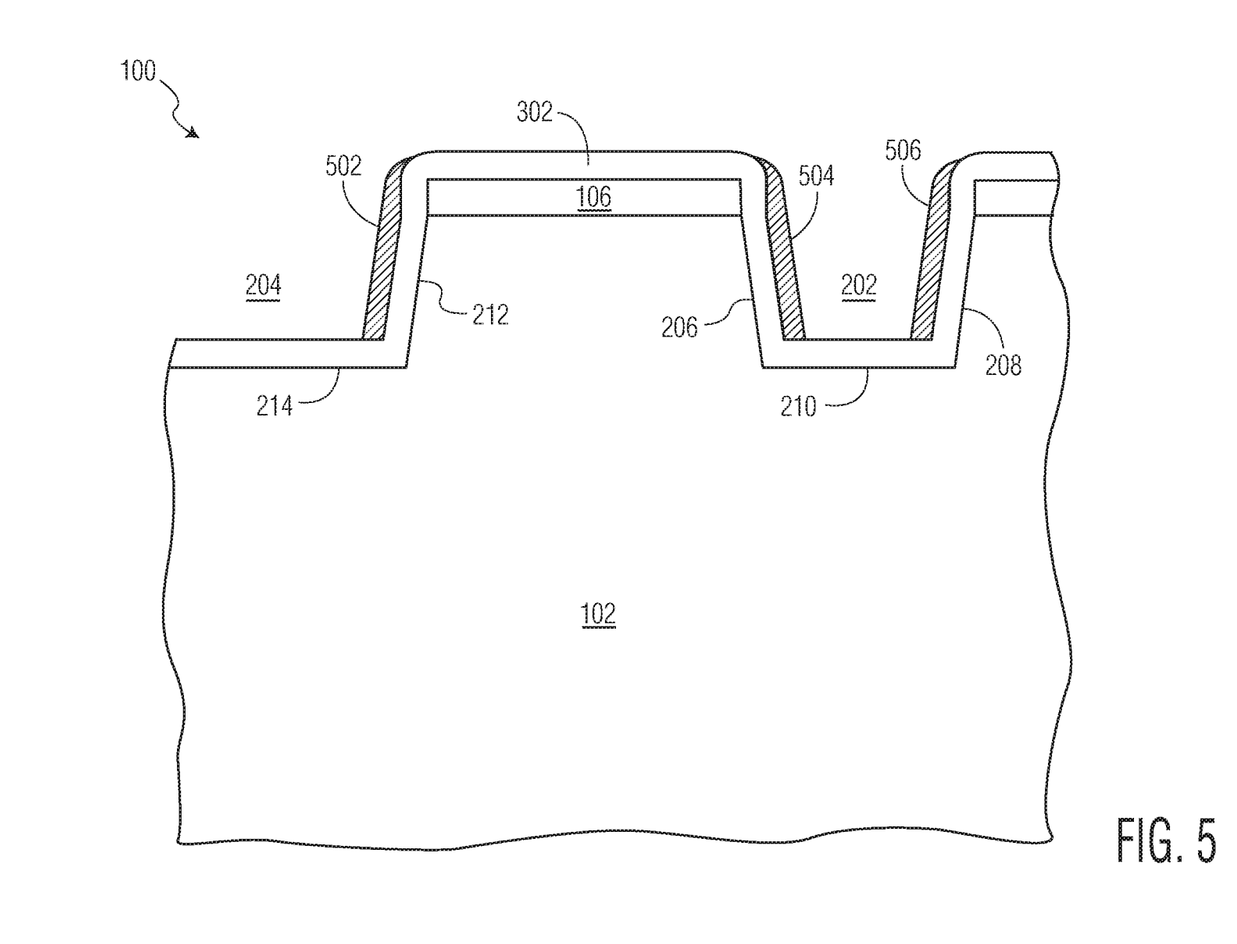

FIG. 5 illustrates in a simplified cross-sectional view, the example LDMOS transistor 100 at a subsequent stage of manufacture in accordance with an embodiment. At this stage, transistor 100 includes conductive spacers 502, 504, and 506 formed from the conductive layer 402. In this embodiment, the conductive layer 402 is etched by way of an anisotropic etch process. As a result, portions of the conductive layer 402 remain at the sidewalls of trenches 202 and 204 thus forming conductive spacers 502, 504, and 506. In this embodiment, the conductive spacers 502, 504, and 506 are offset from respective sidewalls 212, 206, and 208 by a distance approximately equal to the thickness of the non-conductive layer 302 (e.g., ~0.1 microns).

Figure 6:
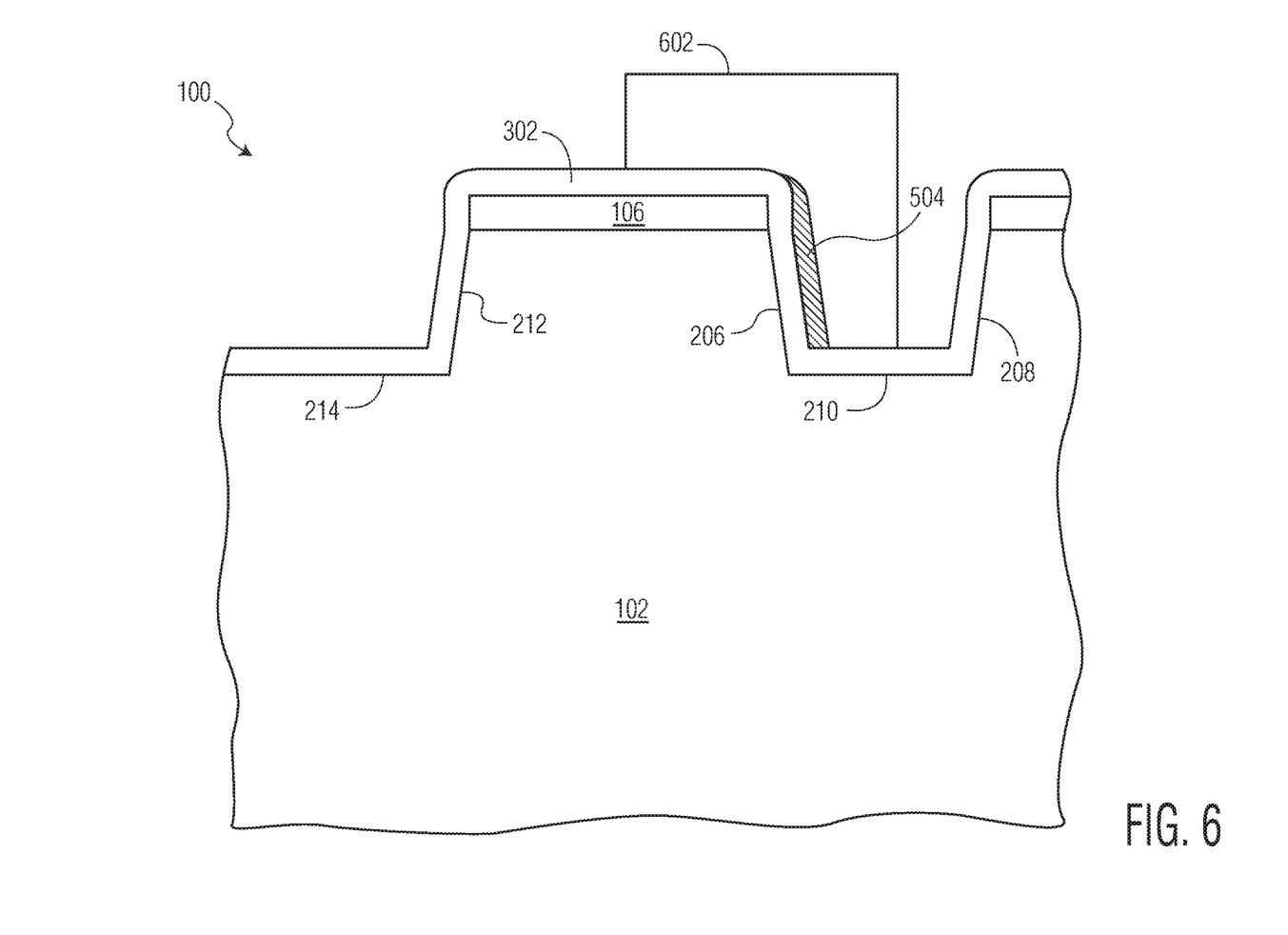

FIG. 6 illustrates in a simplified cross-sectional view, the example LDMOS transistor 100 at a subsequent stage of manufacture in accordance with an embodiment. At this stage, transistor 100 includes conductive spacer 504 remaining after a mask and an etch process steps. In this embodiment, a photoresist material 602 is patterned to mask conductive spacer 504. Following the mask process step, the etch process step is used to remove conductive spacers 502 and 506.

Figure 7:
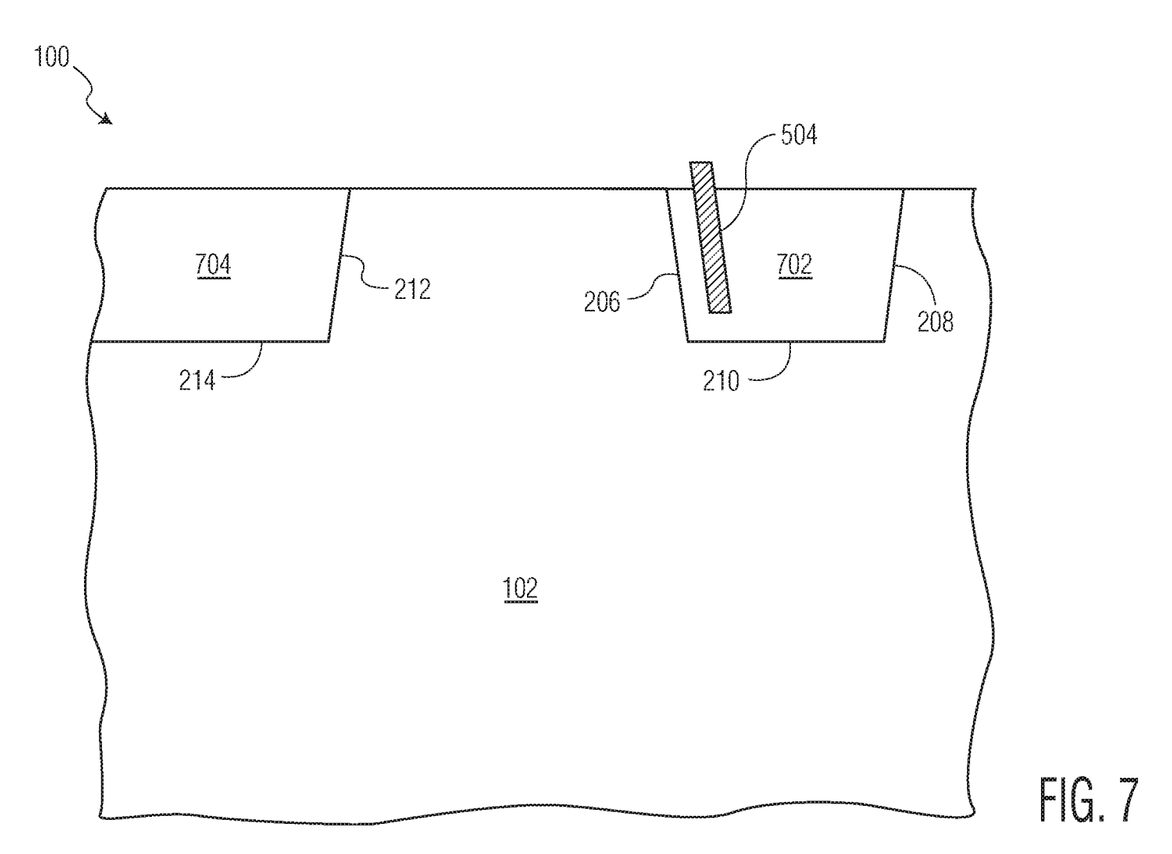

FIG. 7 illustrates in a simplified cross-sectional view, the example LDMOS transistor 100 at a subsequent stage of manufacture in accordance with an embodiment. At this stage, transistor 100 includes a dielectric material 702 and 704 deposited to substantially fill trenches 202 and 204 and substantially surround the conductive spacer 504. The dielectric material 702 and 704 may be formed from a deposited oxide layer such as TEOS, for example. In this embodiment, the dielectric material 702 and 704 and non-conductive layer 302 are formed from a same oxide material. In other embodiments, the dielectric material 702 and 704 and non-conductive layer 302 may be formed from different materials. After filling the trenches 202 and 204 with the dielectric material 702 and 704, a thermal operation may be performed to densify the deposited dielectric material 702 and 704. A planarization operation is then performed to level the top surface of the transistor 100. The nitride layer 106 of the hard mask 104 serves as a stop layer for the planarization operation. In this embodiment, the planarization operation may include a chemical-mechanical planarization (CMP) process. After the planarization operation, the nitride layer 106 is removed by way of an etch process.

Figure 8:
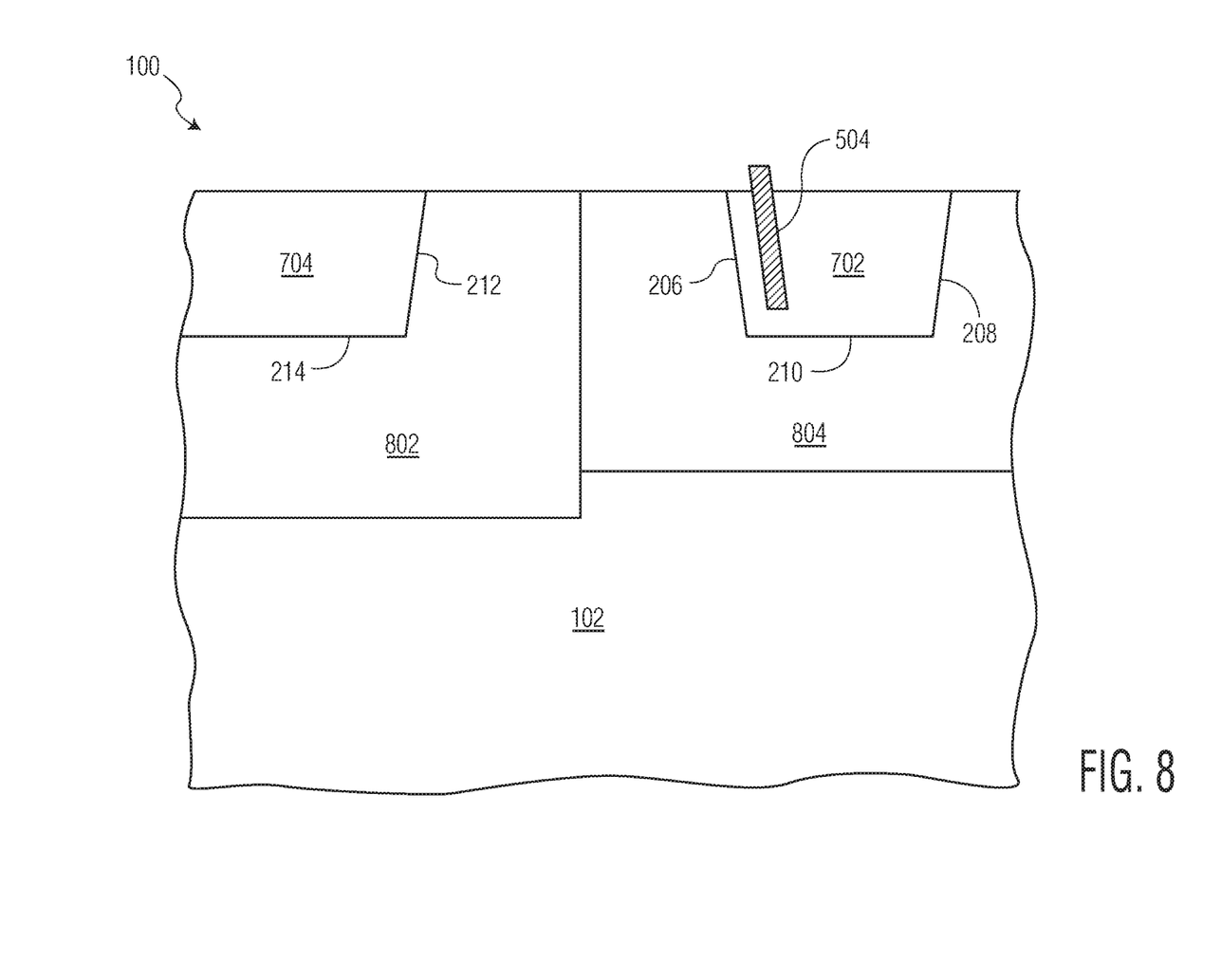

FIG. 8 illustrates in a simplified cross-sectional view, the example LDMOS transistor 100 at a subsequent stage of manufacture in accordance with an embodiment. At this stage, transistor 100 includes a body region 802 and a drift region 804 formed in the substrate 102. In this embodiment, body region 802 is formed as a P-type well dopant implanted region in the substrate 102, adjacent to sidewall 212 and bottom surface 214. The body region 802 may be characterized as a P− (minus) body region. Drift region 804 is formed as an N-type well dopant implanted region in the substrate 102, adjacent to sidewalls 206, 208 and bottom surface 210. The drift region 804 may be characterized as a N− (minus) drift region. In some embodiments, the drift region 804 may be formed from an N-type epitaxial layer of substrate 102.

Figure 9:
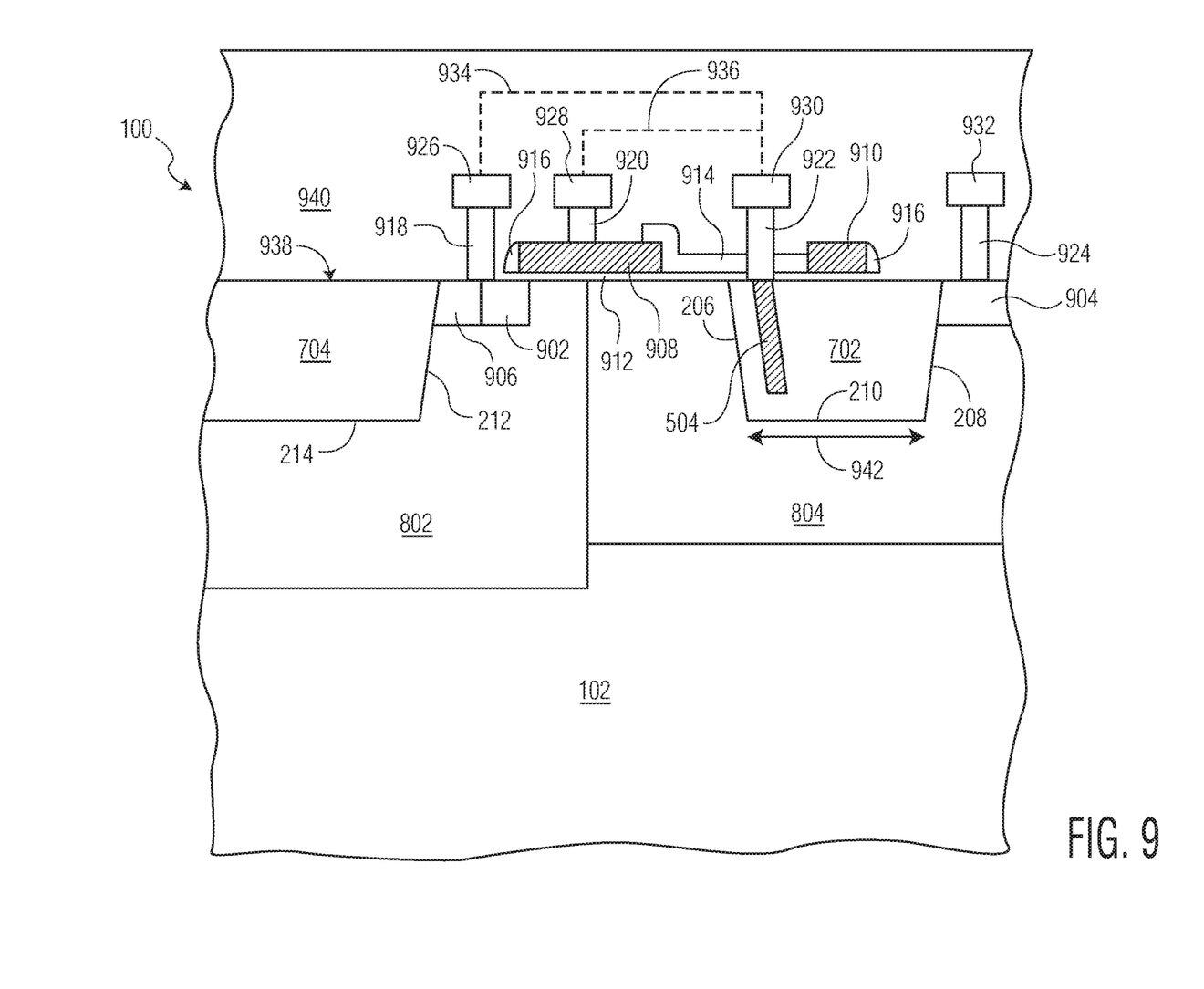

FIG. 9 illustrates in a simplified cross-sectional view, the example LDMOS transistor 100 at a subsequent stage of manufacture in accordance with an embodiment. At this stage, transistor 100 includes source region 902, drain region 904, gate regions 908-910, gate spacer 914, contacts 918-924, conductive traces 926-932, and inter-level dielectric (ILD) region 940.

In this embodiment, a gate dielectric layer 912 is formed on exposed top surface 938 of the substrate 102. The gate dielectric 912 may be formed from any suitable gate dielectric material (e.g., silicon dioxide). The gate dielectric 912 may be formed as a grown layer, deposited layer, or combination thereof. A first gate region 908 and a second gate region 910 are formed on the gate dielectric 912. The gate regions 908 and 910 may be formed from a suitable conductive material such as a polysilicon material or a metal material, for example. In this embodiment, the gate regions 908 and 910 are configured and arranged to serve as a gate electrode for the example LDMOS transistor 100. In other embodiments, the gate regions 908 and 910 may be formed from other conductive materials. The gate spacer 914 is formed on the gate dielectric 912 between the gate regions 908 and 910. A portion of the gate spacer 914 overlaps a portion of the gate region 908. The gate spacer 914 is formed from a non-conductive layer deposited and patterned to cover portions of the drift region 804 and the dielectric material 702 between the gate regions 908 and 910. In this embodiment, the gate spacer 914 may be formed from a suitable non-conductive layer material such as silicon nitride. In this embodiment, gate sidewall spacers 916 are formed at outer sidewalls of the gate regions 908 and 910 during the same process steps forming the gate spacer 914.

After the body region 802 and the drift region 804 are formed, N-type dopants are implanted to form source and drain regions 902 and 904 respectively. Source and drain regions 902 and 904 may be characterized as N+ (plus) source/drain regions, respectively. P-type dopant is implanted in the body region 802 to form body tie region 906 allowing electrical connectivity with body region 802. Body tie region 906 may be characterized as a P+ (plus) body tie region. In this embodiment, body tie region 906 abuts source region 902. Drain region 904 is formed adjacent to a portion of sidewall 208. As a lateral distance 942 increases, corresponding breakdown voltages of transistor 100 increase. In this embodiment, the lateral distance 942 is characterized as a drift distance corresponding to the width of the trench 202. The width of the trench 202 may be determined as the distance between sidewalls 206 and 208, for example. In some embodiments, silicide regions (not shown) may be formed at top surfaces of the source and drain regions 902 and 904, and the body tie region 906. The silicide regions may serve to form a high conductivity contact region at the top surface of source and drain regions 902 and 904 and body tie region 906.

In this embodiment, the ILD region 940 is formed over the gate regions 908 and 910, gate spacer 914 and sidewall spacers 916, and the exposed top surface 938 of the substrate 102. The ILD region 940 may be formed from a series of deposited oxide layers such as TEOS. For example, a first oxide layer of ILD region 940 may be deposited, patterned, and etched to expose portions of gate region 908, source and drain regions 902 and 904, and conductive spacer 504. After the first oxide layer is patterned and etched, contacts 918-924 are formed. Contacts 918-924 may be formed from any suitable conductive material such as copper, gold, silver, aluminum, nickel, tungsten, and alloys thereof, for example. Contacts 918-924 provide a conductive connection to the source and body tie regions 902 and 906, gate region 908, conductive spacer 504, and drain region 904, respectively.

After the contacts 918-924 are formed, a conductive layer is deposited, patterned, and etched to form conductive traces 926-932. The conductive traces 926-932 may be formed from any suitable conductive material such as copper and aluminum, for example. In this embodiment, it may be desirable to connect the conductive spacer 504 to a known voltage source rather than allowed to float. For example, in some embodiments, the conductive spacer 504 may be interconnected to the source region 902 by way of interconnect 934 (e.g., illustrated as a dashed line), conductive traces 926 and 930, and respective contacts 918 and 922. In some embodiments, the conductive spacer 504 may be interconnected to the gate region 908 by way of interconnect 934 (e.g., illustrated as a dashed line), conductive traces 928 and 930, and respective contacts 920 and 922.

Figure 10A:
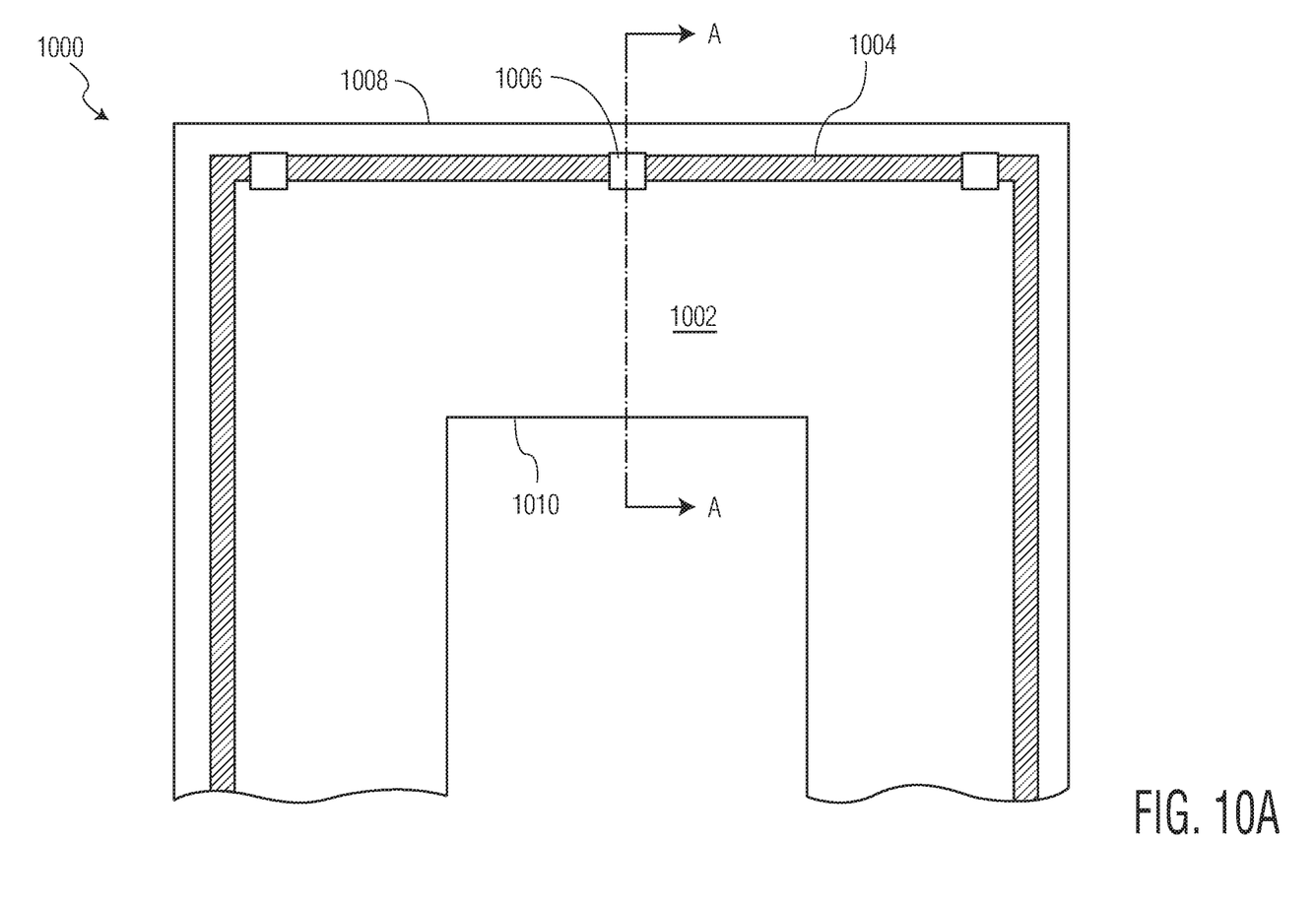
FIG. 10A and FIG. 10B illustrate, in simplified cross-sectional view and corresponding plan view, an example conductive spacer arrangement in accordance with an embodiment.
Figure 10B:
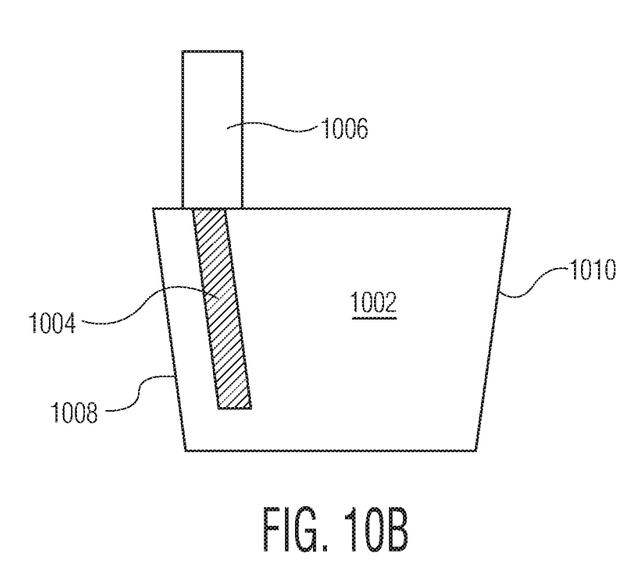

FIG. 10A and FIG. 10B illustrate, in simplified cross-sectional view and corresponding plan view, an example conductive spacer arrangement 1000 in accordance with an embodiment. In the simplified plan view of FIG. 10A, a portion of the example LDMOS transistor 100 is shown including filled trench 1002, conductive spacer 1004, and contacts 1006. A corresponding cross-sectional view along line A-A is depicted in FIG. 10B. For example, the filled trench 1002 corresponds to the dielectric material filled trench 702 of FIG. 9, the conductive spacer 1004 corresponds to the conductive spacer 504 of FIG. 9, and the contact(s) 1006 corresponds to the contact 922 of FIG. 9. An inner sidewall 1010 corresponds to sidewall 208 adjacent to the drain region 904 of FIG. 9, and an outer sidewall 1008 corresponds to sidewall 206 of FIG. 9. In this embodiment, a plurality of contacts 1006 are formed along a portion of the conductive spacer 1004. Here the contacts 1006 are arranged substantially aligned with the top edge of the conductive spacer 1004 and substantially planar with a top surface of the filled trench 1002.

Figure 11A:
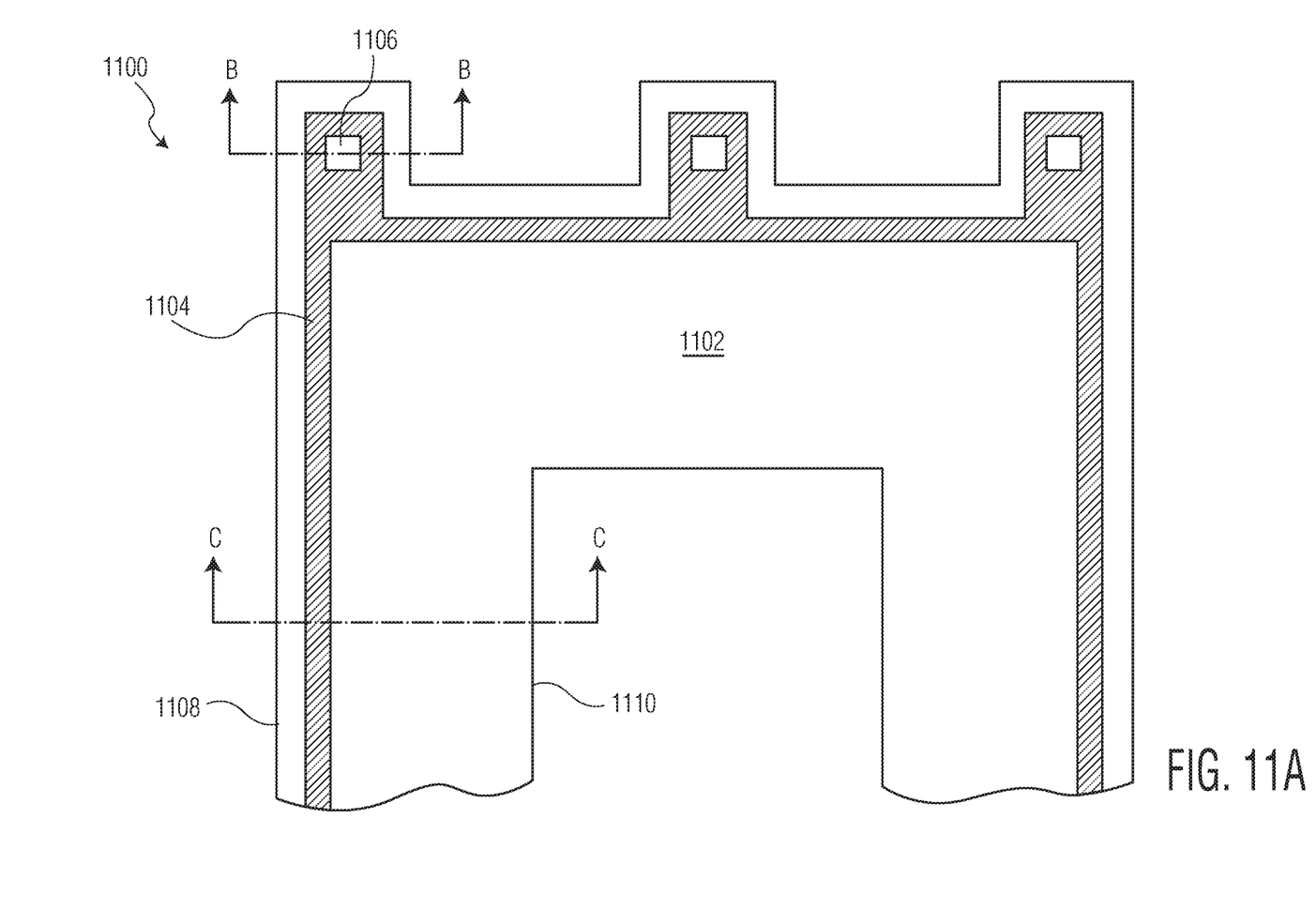
FIG. 11A through FIG. 11C illustrate, in simplified cross-sectional view and corresponding plan view, an alternative example conductive spacer arrangement in accordance with an embodiment.
Figure 11B:
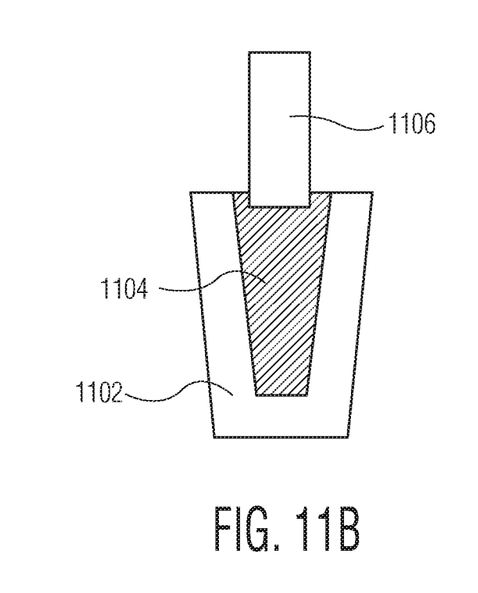
Figure 11C:
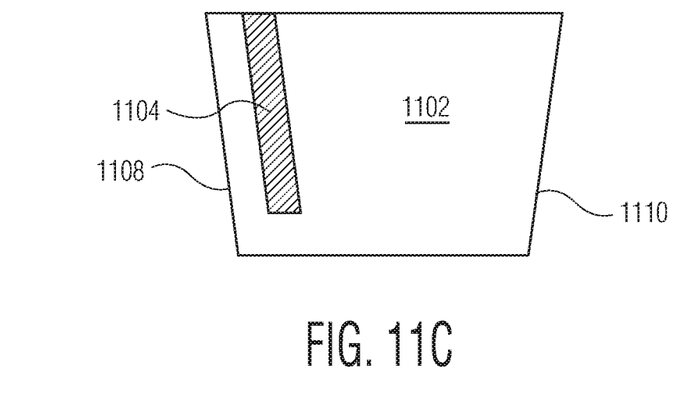

FIG. 11A through FIG. 11C illustrate, in simplified cross-sectional view and corresponding plan view, an alternative example conductive spacer arrangement 1100 in accordance with an embodiment. In the simplified plan view of FIG. 11A, a portion of an example LDMOS transistor like transistor 100 is shown including filled trench 1102, conductive spacer 1104 with conductive tabs, and contacts 1106. A corresponding cross-sectional view along line B-B is depicted in FIG. 11B, and a cross-sectional view along line C-C is depicted in FIG. 11C. In this embodiment, the filled trench 1102 corresponds to the dielectric material filled trench 702 of FIG. 9, and the conductive spacer 1104 corresponds to the conductive spacer 504 of FIG. 9. An inner sidewall 1110 corresponds to sidewall 208 adjacent to the drain region 904 of FIG. 9, and an outer sidewall 1108 corresponds to sidewall 206 of FIG. 9. In this embodiment, conductive tabs are formed along with the formation of the conductive spacer 1104. Each tab provides a broader landing or connection interface for contacts 1106. The tabs are formed and distributed along a portion of the conductive spacer 1104. Here the contacts are substantially aligned with the top edge of the tabs and substantially planar with a top surface of the filled trench 1102. Because the tabs are wider (e.g., ~2× wider) than the thickness of the conductive spacer 1104, more margin exists when aligning the contacts 1106 to the tabs.

Generally, there is provided, a transistor including a trench formed in a semiconductor substrate; a conductive spacer formed in the trench, the conductive spacer offset from a first sidewall of the trench; a dielectric material formed in the trench, the dielectric material substantially surrounding the conductive spacer; a drift region formed in the semiconductor substrate adjacent to the first sidewall and a first portion of a second sidewall of the trench, the drift region having a first conductivity type; a drain region formed in the drift region, the drain region adjacent to a second portion of the second sidewall; and a first gate region overlapping a portion of the drift region, the first gate region separate from the conductive spacer. The transistor may further include a second gate region spaced apart from the first gate region and formed over the dielectric material, the second gate region separate from the conductive spacer. The transistor may further include a non-conductive layer formed over the drift region and the dielectric material between the first gate region and the second gate region, the non-conductive layer overlapping a portion of the first gate region. The transistor may further include a first conductive trace conductively connected to the conductive spacer by way of a first contact. The transistor may further include a second conductive trace conductively connected to the first gate region by way of a second contact, the second conductive trace connected to the first conductive trace. The transistor may further include a source region formed in the semiconductor substrate, the first gate region formed over the semiconductor substrate between the source region and the first sidewall. The transistor may further include a body region having a second conductivity type formed in the semiconductor substrate adjacent to the drift region, the source region formed in the body region. The transistor of claim 6, further comprising a third conductive trace conductively connected to the source region by way of a third contact, the third conductive trace connected to the first conductive trace. The conductive spacer and the first gate region may be formed from a polysilicon material, the conductive spacer and the first gate region formed from different polysilicon material layer depositions.

In another embodiment, there is provided, a method including etching a trench in a semiconductor substrate, the trench having a first sidewall and a second sidewall; forming a substantially vertical conductive spacer from a first conductive layer deposited in the trench, the conductive spacer proximate to the first sidewall; depositing a dielectric material to substantially fill the trench, the dielectric material substantially surrounding the conductive spacer; forming a drift region in the semiconductor substrate adjacent to the first sidewall and a first portion of the second sidewall, the drift region having a first conductivity type; forming a drain region in the drift region, the drain region adjacent to a second portion of the second sidewall; and forming a first gate region from a second conductive layer deposited over the semiconductor substrate, the first gate region overlapping a portion of the drift region. The method may further include forming a second gate region from the second conductive layer, the second gate region formed over the dielectric material. The method may further include forming a non-conductive layer over the drift region and the dielectric material between the first gate region and the second gate region, the non-conductive layer overlapping a portion of the first gate region. The first conductive layer and the second conductive layer may each be formed from a polysilicon material. The method may further include forming a source region in the semiconductor substrate, the first gate region formed over the semiconductor substrate between the source region and the first sidewall. The method may further include forming a body region having a second conductivity type in the semiconductor substrate adjacent to the drift region, the source region formed in the body region. The method may further include forming a gate dielectric layer over the semiconductor substrate, the second conductive layer deposited on the gate dielectric layer.

In yet another embodiment, there is provided, a method including etching a trench in a semiconductor substrate, the trench having a first sidewall, a second sidewall, and a bottom surface; depositing a dielectric layer on the first sidewall, the second sidewall, and the bottom surface of the trench with a conductive material to form a gate region; depositing a first conductive layer on the dielectric layer; selectively etching the first conductive layer to remove the first conductive layer proximate to the second sidewall and the bottom surface of the trench, a conductive spacer formed by the remaining conductive layer proximate to the first sidewall; depositing a dielectric material to substantially fill the trench, the dielectric material substantially surrounding the conductive spacer; forming a drift region in the semiconductor substrate adjacent to the first sidewall and a first portion of the second sidewall, the drift region having a first conductivity type; forming a drain region in the drift region, the drain region adjacent to a second portion of the second sidewall; and forming a first gate region from a second conductive layer deposited over the semiconductor substrate, the first gate region overlapping a portion of the drift region. The method may further include forming a body region in the semiconductor substrate adjacent to the drift region, the body region having a second conductivity type; and forming a source region in the body region, the first gate region formed over the semiconductor substrate between the source region and the first sidewall. The method may further include forming a first contact conductively connected to the conductive spacer; forming a second contact conductively connected to the first gate region; forming a third contact conductively connected to the source region; and interconnecting the first contact with the second contact or the third contact. The first conductive layer and the second conductive layer may each be formed from a polysilicon material.

By now it should be appreciated that there has been provided, an STI LDMOS transistor. A trench is formed in a drift region of a substrate of the LDMOS transistor. A drain region is formed at the surface of the semiconductor substrate adjacent to a first sidewall the trench. A source region is formed at the surface of the semiconductor substrate separated from a second sidewall of the trench by a predetermined distance. A conductive spacer is formed in the trench proximate to the second sidewall of the trench. After the conductive spacer is formed, the trench is filled with a dielectric material. The conductive spacer is configured to lower impact ionization at the first sidewall of the trench improving overall reliability of the LDMOS transistor.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
    etching a trench in a semiconductor substrate, the trench having a first sidewall and a second sidewall;
    forming a substantially vertical conductive spacer from a first conductive layer deposited in the trench, the conductive spacer proximate to the first sidewall;
    depositing a dielectric material to substantially fill the trench, the dielectric material substantially surrounding the conductive spacer;
    forming a drift region in the semiconductor substrate adjacent to the first sidewall and a first portion of the second sidewall, the drift region having a first conductivity type;
    forming a drain region in the drift region, the drain region directly adjacent to a second portion of the second sidewall separate from and above the first portion of the second sidewall; and
    forming a first gate region from a second conductive layer deposited over the semiconductor substrate, the first gate region overlapping a portion of the drift region and not overlapping the dielectric material.

2. The method of claim 1, further comprising forming a second gate region from the second conductive layer, the second gate region formed over the dielectric material.

3. The method of claim 2, further comprising forming a non-conductive layer over spanning adjacent portions of the drift region and the dielectric material between the first gate region and the second gate region, the non-conductive layer overlapping a portion of the first gate region.

4. The method of claim 1, wherein the first conductive layer and the second conductive layer are each formed from a polysilicon material.

5. The method of claim 1, further comprising forming a source region in the semiconductor substrate, the first gate region formed over the semiconductor substrate between the source region and the first sidewall.

6. The method of claim 5, further comprising forming a body region having a second conductivity type in the semiconductor substrate adjacent to the drift region, the source region formed in the body region.

7. The method of claim 1, further comprising forming a gate dielectric layer over the semiconductor substrate, the second conductive layer deposited on the gate dielectric layer.

8. A method comprising:
    etching a trench in a semiconductor substrate, the trench having a first sidewall, a second sidewall, and a bottom surface;
    depositing a dielectric layer on the first sidewall, the second sidewall, and the bottom surface of the trench with a conductive material to form a gate region;
    depositing a first conductive layer on the dielectric layer;
    selectively etching the first conductive layer to remove the first conductive layer proximate to the second sidewall and the bottom surface of the trench, a conductive spacer formed by the remaining conductive layer proximate to the first sidewall;
    depositing a dielectric material to substantially fill the trench, the dielectric material substantially surrounding the conductive spacer;
    forming a drift region in the semiconductor substrate adjacent to the first sidewall and a first portion of the second sidewall, the drift region having a first conductivity type;
    forming a drain region in the drift region, the drain region directly adjacent to a second portion of the second sidewall separate from and above the first portion of the second sidewall; and
    forming a first gate region from a second conductive layer deposited over the semiconductor substrate, the first gate region overlapping a portion of the drift region and not overlapping the dielectric material.

9. The method of claim 8, further comprising:
forming a body region in the semiconductor substrate adjacent to the drift region, the body region having a second conductivity type; and
forming a source region in the body region, the first gate region formed over the semiconductor substrate between the source region and the first sidewall.

10. The method of claim 9, further comprising:
forming a first contact conductively connected to the conductive spacer;
forming a second contact conductively connected to the first gate region;
forming a third contact conductively connected to the source region; and
interconnecting the first contact with the second contact or the third contact.

11. The method of claim 8, wherein the first conductive layer and the second conductive layer are each formed from a polysilicon material.

* * * * *